United States Patent
Guo et al.

[11] Patent Number: 5,918,125
[45] Date of Patent: Jun. 29, 1999

[54] PROCESS FOR MANUFACTURING A DUAL FLOATING GATE OXIDE FLASH MEMORY CELL

[75] Inventors: Jyh-Chyurn Guo, Chutung Hsinchu; Fu-Chia Shone, Hsinchu, both of Taiwan

[73] Assignee: Macronix International Co., Ltd., Hsinchu, Taiwan

[21] Appl. No.: 08/717,337

[22] Filed: Sep. 19, 1996

[51] Int. Cl.$^6$ ............................................. H01L 21/8247
[52] U.S. Cl. ........................... 438/264; 438/286; 438/592
[58] Field of Search ................................... 438/263, 264, 438/981, 286, 592

[56] References Cited

U.S. PATENT DOCUMENTS

| | | |
|---|---|---|
| 5,102,814 | 4/1992 | Woo . |
| 5,108,939 | 4/1992 | Manley et al. . |
| 5,352,619 | 10/1994 | Hong . |
| 5,427,968 | 6/1995 | Hong . |
| 5,427,970 | 6/1995 | Hsue et al. . |
| 5,439,838 | 8/1995 | Yang ......................................... 437/43 |
| 5,457,061 | 10/1995 | Hong et al. ............................... 437/43 |
| 5,460,991 | 10/1995 | Hong . |
| 5,521,109 | 5/1996 | Hsue et al. . |

FOREIGN PATENT DOCUMENTS

| | | |
|---|---|---|
| 0 506 287 A1 | 9/1992 | European Pat. Off. . |
| 0 590 319 A2 | 4/1994 | European Pat. Off. . |
| WO94/22171 | 9/1994 | WIPO . |

*Primary Examiner*—Richard A. Booth
*Attorney, Agent, or Firm*—Mark A. Haynes; Wilson, Sonsini, Goodrich & Rosati

[57] ABSTRACT

An improved floating gate memory cell, having a dual thickness floating gate oxide, minimizes the band-to-band tunneling current and hot hole injection current suffered by the device, maximizes the Fowler-Nordheim tunneling current, allows lower operational voltages and provides a scalable structure. The process for manufacturing the dual thickness floating gate oxide structure comprises the steps of (1) forming a thicker insulator region over a channel region on the substrate, the thicker insulator having a source side and a drain side; (2) forming a thinner insulator on one or both of the source side and the drain side of the thicker insulator, and over a tunnel region in the substrate that is adjacent to the channel region; and (3) after forming the thinner insulator, distributing dopants in the source and the drain so that a concentration of dopants in the tunnel region beneath the thinner insulator is near or greater than a degenerately doped concentration. The step of distributing the dopants involves a process which does not damage the thinner insulator in the tunnel region. The floating gate is formed over the thicker insulator and the thinner insulator, and a control gate insulator and control gate are formed to complete the structure of the device. In this manner, a high-quality tunnel oxide is grown over the substrate while it is moderately doped. After growing a high quality tunnel oxide, the source and drain dopants are distributed into the device. In the tunnel region, where the floating gate oxide is thinner, the concentration of dopants in the substrate is quite high due to the source and drain dopants. This prevents band bending, at a level sufficient to induce band-to-band tunneling. In the channel region, where the concentration of dopants is more moderate, the thicker insulator prevents formation of an electric field sufficient to induce significant band-to-band tunneling.

17 Claims, 10 Drawing Sheets

PROCESS FOR MANUFACTURING A DUAL FLOATING GATE OXIDE FLASH MEMORY CELL

BACKGROUND OF THE INVENTION

1. Field of the Invention

The present invention relates to integrated circuit manufacturing, and more particularly to techniques for manufacturing integrated circuit memory devices based on floating gate memory cells having dual floating gate oxide structures.

2. Description of Related Art

Floating gate transistors are the basis of a number of integrated circuit memory devices, including flash memory. In flash memory design, improvements are being made in floating gate transistor design to allow lower voltage operation, larger memory arrays, and improved endurance and charge retention of the memory cells.

One floating gate transistor design described by Hisamune, et al., "A High Capacitive-Coupling Ratio (HiCR) Cell for 3 V-Only 64 Mbit and Future Flash Memories," IEDM 1993, pp. 19–22, involves the use of a so-called dual thickness gate oxide structure. According to the Hisamune, et al. structure, the oxide between the semiconductor substrate and the floating gate of a floating gate cell has a thicker region over the moderately doped channel, and a thinner tunnel region on the sides of the channel adjacent to source and drain. This has the effect of increasing the capacitive-coupling ratio of the cell, allowing lower voltage operation of the flash memory cells.

The capacitive-coupling ratio is defined by the quotient of the capacitance of the inter-poly dielectric between the control gate and the floating gate, and the total capacitance of the floating gate structure between the control gate and the source and drain regions. By reducing the total capacitance of the floating gate and increasing the capacitance between the floating gate and the control gate, using the dual thickness gate oxide, the capacitive-coupling ratio is increased. A higher capacitive-coupling ratio allows lower voltage operation, because a greater proportion of the voltage applied to the control gate of the floating gate cell is transferred to the floating gate. Higher voltage on the floating gate increases the electric field across the floating gate regions of the tunnel oxide, and thereby increases the efficiency of the tunneling operations used for programming and/or erasing the array.

Although the Hisamune, et al. structure is suitable for establishing low voltage operation on flash memory devices, the design does not address critical problems with prior art floating gate cells in general. In particular, charge retention and endurance of floating gate cells are limited by so-called band-to-band tunneling current and hot hole injection current, which occur between the floating gate and the source, drain and/or substrate of the transistor. According to the Hisamune, et al. structure, and other prior art structures, sufficient control of the band-to-band tunneling current has not been achieved. In Hisamune, et al., for example, the tunnel oxide quality and thickness uniformity in the dual thickness gate oxide structure proposed are difficult to control. Without control of the quality of the oxide, and other parameters in the manufacturing process, band-to-band tunneling current and hot hole injection are not adequately controlled, and the endurance and charge retention characteristics of the device suffer.

Accordingly, it is desirable to provide an improved manufacturing process and design for a floating gate transistor having a dual thickness floating gate oxide.

SUMMARY OF THE INVENTION

The present invention provides an improved floating gate memory cell, having a dual thickness floating gate oxide, which minimizes the band-to-band tunneling current and hot hole injection current suffered by the device, maximizes the Fowler-Nordheim tunneling current to enhance the programming and erasing speed, allows lower operational voltages and power supply voltages, and provides a scalable structure so that cell feature size may shrink with improved manufacturing resolution.

The invention is based on a process for manufacturing a dual thickness floating gate oxide structure, and comprises the steps of:

forming a thicker insulator region on the substrate over a channel region, the thicker insulator having a source side and a drain side and constituting;

forming a thinner insulator on one or both of the source side and the drain side of the thicker insulator, and over a tunnel region in the substrate that is adjacent to the channel region; and after forming the thinner insulator, distributing dopants in the source and the drain so that a concentration of dopants in the tunnel region beneath the thinner insulator is near or greater than a degenerately doped concentration.

The manufacturing process, in one embodiment involves forming a thicker insulator on the silicon substrate which will constitute the gate insulator of the channel region. The first layer of polysilicon (PL1) is deposited over the mentioned thicker insulator and then a nitride ($Si_3N_4$) film is deposited over PL1; after that, an anisotropic etch (e.g. plasma etch) is performed on the stack layers consisting of insulator, polysilicon, and nitride films. In such etch process, the poly-gate length of the cell device is defined and patterned. PL1 is one of the layers constituting the floating gate (FG) of the cell device. Next, the thinner insulator is formed to constitute the tunnel regions which will be formed as the source and drain regions by adopting N-type heavy dose implant. Nitride spacers or poly spacers are formed to cover the tunnel insulator and to act as the mask for the subsequent heavy dose implants. Subjected to the subsequent thermal cycles, the implanted impurities with heavy dose will diffuse from the spacer edges toward the channel region covered by the thicker insulator. The implant dose is controlled to be high enough to make the regions covered by the tunnel insulator be degenerately doped. Oxide over the source and drain regions BSOX is formed by CVD (Chemical Vapor Deposition) techniques to cover source and drain regions, and an etch-back technique is used to achieve planarization. The planarized BSOX is required for the following critical etching processes such as SAMOS etch and word-line patterning etch, etc. After that, nitride spacers are removed and the second layer of polysilicon (PL1A) is deposited and patterned to complete the formation of the floating gate; i.e. PL1 and PL1A constitute the floating gate. A stack layer of oxide/nitride/oxide (ONO) is deposited over floating gate and then the third layer of polysilicon is deposited over the ONO to act as the control gate (CG). Up to now, we can see that the purpose of two layers of polysilicon to make floating gate is to increase floating gate and ONO area so that the CG-to-FG capacitance ($C_{CF}$) and the gate coupling ratio (GCR) can be increased.

The step of distributing the dopants involves a process which minimizes the damage to the thinner insulator in the tunnel region, as discussed below. A high-quality tunnel oxide is grown over the silicon substrate, when it is moderately doped. After that, nitride spacers or poly spacers are formed to mask the heavy dose implant which can effectively suppress the damage originated from the recoiled oxygen atoms. After a high-quality tunnel oxide is formed, source and drain regions are formed by the lateral diffusion of the heavy dose implant under nitride or poly spacer. In this manner, implant induced damage to the tunnel oxide can be minimized and good thickness uniformity over the tunnel region can be achieved.

In the tunnel region, where the floating gate oxide is thinner, the concentration of dopants in the substrate is quite high due to the source and drain dopants. This prevents a large band bending sufficient to induce band-to-band tunneling. In the channel region, where the concentration of dopants is more moderate, the thicker insulator prevents formation of an electric field sufficient to induce significant band-to-band tunneling.

The invention can also be characterized as a method for manufacturing a floating gate transistor on a substrate. The transistor has a drain in the substrate, a source in the substrate, a channel in the substrate between the source and the drain, a floating gate over the channel, a floating gate insulator between the floating gate and the substrate, a control gate over the floating gate, and a control gate insulator between the floating gate and the control gate. The method includes steps of forming an insulator layer, such as a layer comprising silicon dioxide or silicon oxynitride having a thickness of about 15 to 25 nm, on the substrate. Next, a layer of floating gate material is formed over the insulator layer. Then a cap material is placed over the first floating gate material layer. The cap material, floating gate material and insulator layer are etched to define a stack structure which defines the channel length. For example, the channel length may be on the order of about 0.2 microns to 0.5 microns. Next, a tunnel insulator is formed over the substrate and the sides of the stack structure, at least in a tunnel region adjacent to the stack structure. The tunnel insulator comprises silicon dioxide or silicon oxynitride having a thickness of about 5 to 10 nm. Side wall spacers are formed on the sides of the stack structure and over the tunnel insulator layer to define the width of the tunnel region in the substrate. The spacers comprise, for example, polysilicon or silicon nitride, and are formed by depositing a layer of uniform thickness over the stack structure and tunnel insulator, and then anisotropically etching the spacer material until only side walls remain having a width of about 0.05 to 0.15 microns. (The aspect ratio of thickness width can be adjusted by plasma etch conditions; e.g., plasma power, plasma density, gas composition, etc.)

After forming the side wall spacers, source and drain dopants are implanted into the substrate in alignment with the side wall spacers to define the source and drain. During this process, the side wall spacers mask the tunnel insulator layer over the tunnel region and mask the underlying substrate from the dopants being implanted, and prevent damage to the tunnel insulator layer. In a preferred system, this process involves first implanting dopants on the drain side, followed by a process of implanting dopants on both the source and drain sides, so that the drain region has greater dopant concentration than the source region.

After implanting the source and drain dopants, the side wall spacers are removed and formation of the floating gate is completed. The formation of the floating gate is completed by forming a second layer of floating gate material in electrical contact with the floating gate material in the stack structure, and over the tunnel insulator layer in the tunnel region. Preferably, an isolation insulator is formed over the substrate adjacent to side wall spacers prior to removal of the side wall spacers. The second layer of floating gate material is deposited into the region in which the side wall spacers had been removed, and overlaps the isolation insulator and the stack structure, increasing the area of the floating gate and improving the capacitive-coupling ratio.

Finally, a control gate insulator manufactured with a silicon oxide, silicon nitride, silicon oxide (ONO) structure, is formed over the floating gate. Then, a third layer of polysilicon is deposited to form the control gate, i.e. wordline.

The process of the present invention minimizes the band-to-band tunneling current and hot hole injection current by providing a thin insulator with high quality in regions where the dopant concentration in the substrate is high, and desired source and drain tunneling is required, while using a thicker insulator over the channel region where the dopant concentrations are low. Simulation suggests that the improvement achieved by the present invention can be as much as 5 orders of magnitude reduction in band-to-band tunneling current. Also, the thin insulator over the tunnel region is a high-quality insulator which has not been formed over a highly-doped substrate, and has not been subject to bombardment during the dopant implant processes. Fowler-Nordheim tunneling current is maximized in the structure because of the tunnel insulator over the degenerately doped source and drain regions. This enhances the program and erase speed of the device. Furthermore, the dual thickness floating gate structure allows scalability of the operation and power supply voltages on the device, allowing a low power, flash memory integrated circuit. Finally, the cell layout is scalable, because drain engineering techniques required for reliability issues in prior designs, are not necessary with the process of the present invention.

Other aspects and advantages of the present invention can be seen upon review of the figures, the detailed description and the claims which follow.

DETAILED DESCRIPTION

Figure 1:
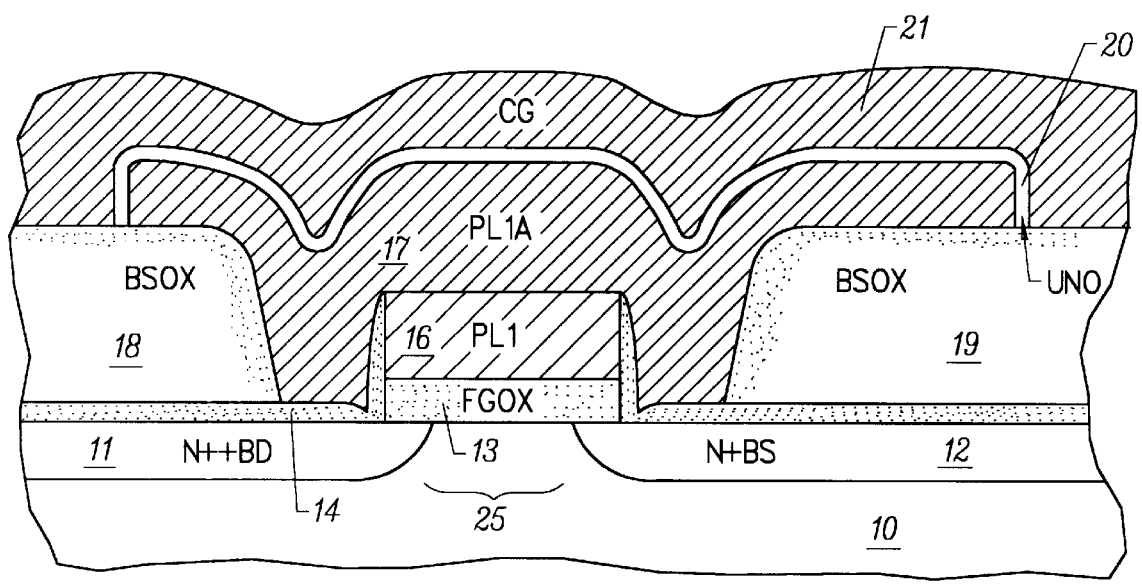
FIG. 1 is a cross-section of the floating gate transistor manufactured according to the present invention.

A detailed description of embodiments of the present invention is provided with respect to FIGS. 1 through 18, in which FIG. 1 illustrates the structure of a dual thickness floating gate oxide transistor, according to the present invention. FIGS. 2 through 13 illustrate the key processing steps according to the manufacturing technique of the present invention. FIGS. 14 through 18 are directed to illustrating characteristics of the resulting floating gate memory cell.

FIG. 1 is a cross-sectional view of the dual floating gate oxide memory cell structure of the present invention. The structure is formed on a silicon substrate 10. The substrate is typically a moderately doped P-type substrate, and may have a so-called dual cell implants to improve the anti-punchthrough characteristics of the device as described in more detail below. Implanted in the substrate 10 are a drain region 11 and a source region 12. The drain region is a N++ doped region and the source region is an N+ doped region. A floating gate oxide for the device includes first a thicker region 13 and a second thinner region 14 over a portion of the drain, and a third thinner region 15 over a portion of the source. The floating gate structure overlies the floating gate oxide structure (13, 14, 15). The floating gate structure includes a first layer 16 and a second layer 17. As described in more detail below, the first layer 16 is used to provide self-alignment of the source region 12 and the drain region 11. The second layer 17 is deposited after implant of the source region 11 and drain region 12, to provide an increased area for the floating gate structure. Thick oxide regions 18 and 19 are formed over the buried source 12 and buried drain 11. Over the floating gate structure (16, 17) a control gate insulator 20 is formed. The control gate insulator 20 is preferably formed of a three-layer silicon dioxide/silicon nitride/silicon dioxide sandwich (ONO). After formation of the control gate oxide, a control gate structure 21 is formed to complete formation of the cell. Planarization, passivation and metalization layers (not shown) are deposited over the top of the control gate 21 to complete layout of an integrated circuit memory using the dual thickness floating gate oxide structure of the present invention.

As can be seen, the floating gate oxide structure (13, 14, 15) includes a thicker oxide 13 region in a channel area 25 of the device, and thinner oxide regions 14, 15 over the more heavily doped buried drain diffusion 1 and buried source diffusion 12. The heavily doped buried drain and buried source retard band-to-band tunneling in the tunneling regions of the floating gate oxide, while the thicker oxide in the channel region, generally 25, retards band-to-band tunneling over the moderately doped channel. However, Fowler-Nordheim tunneling, which is desired for the program and erase processes of the floating gate cell, are enhanced by the thinner oxide over the buried source 12 and buried drain 11 regions. Additionally, the capacitive-coupling ratio is increased by the structure, allowing lower-voltage operation of the cell.

The thin oxide 14, 15 in the cell is a high-quality film formed in a manner that prevents exposure of the substrate and tunnel oxide to ion implantation damage, and yet is formed on the substrate 10 before the implantation of the buried drain 11 and buried source 12 regions, so the tunnel oxide growth is not adversely affected by high n-type doping.

A preferred manufacturing technique for the cell structure of FIG. 1 is illustrated in FIGS. 2 through 13.

Figure 2:
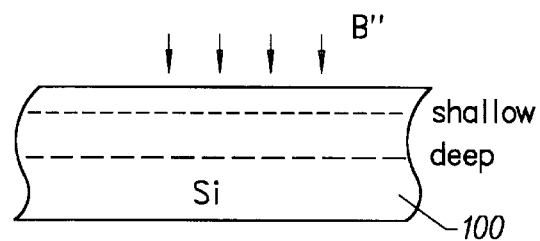
FIGS. 2 through 13 illustrate processing steps used in the method of manufacturing according to the present invention.

FIG. 2 illustrates a dual cell implant process. According to this process, the wafer 100 is a single-crystal silicon (100 orientation) implanted with a deep boron $B^{11}$ dopant (101) and a shallow boron $B^{11}$ implant (102). The deep cell implant is an anti-punchthrough implant, implanted with an energy of, for example, 125 Kev. The shallow cell implant is used to adjust the threshold voltage in the channel region, implanted with an energy of for example, 50 Kev. This doping has a p-type moderate concentration level, well below the degenerate concentration level.

Figure 3:
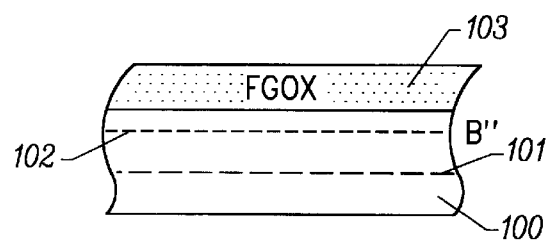

FIG. 3 illustrates the next step in the process. The silicon substrate 100, having the deep implant 101 and the shallow implant 102 with a P-type dopant $B^{11}$ is subjected to a process to grow a thicker floating gate insulator layer 103, comprising, for example, silicon dioxide or silicon oxynitride. Conventional gate oxidation processes, such as wet or dry thermal oxidation may be used.

Figure 4:
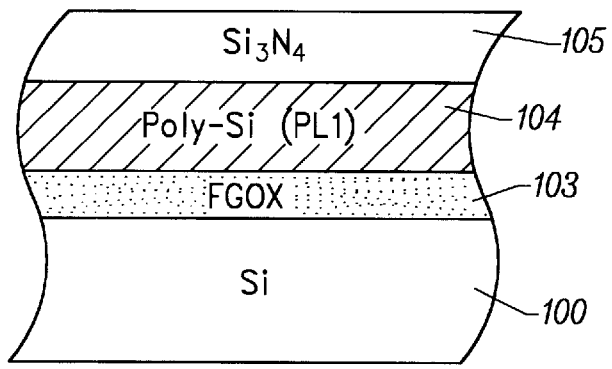

FIG. 4 illustrates the next two process steps in the sequence. In FIG. 4, the substrate 100 and the thicker insulator layer 103 are subjected to a process to grow a layer 104 of polysilicon, or other floating gate material, over the thicker insulator layer 103. A cap material layer 105, preferably consisting of silicon nitride, is formed over the polysilicon layer 104.

Figure 5:
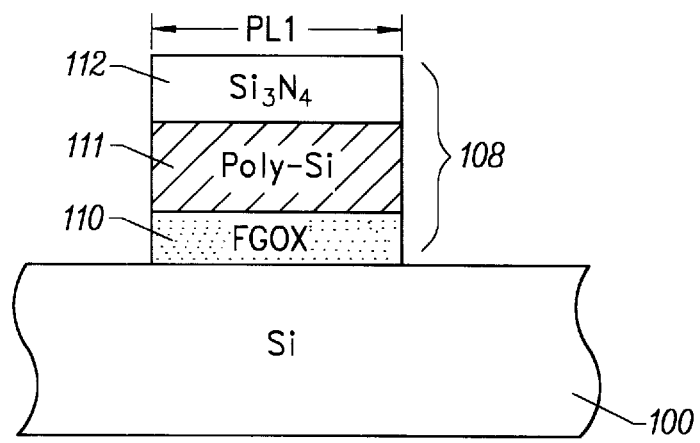

FIG. 5 illustrates the patterning of the silicon nitride, polysilicon, floating gate insulator structure. Thus, after patterning, a stack structure 108 is formed on the substrate 100. The stack structure includes a thicker floating gate insulator region 100, a polysilicon region 111, and a cap region 112.

Figure 6:
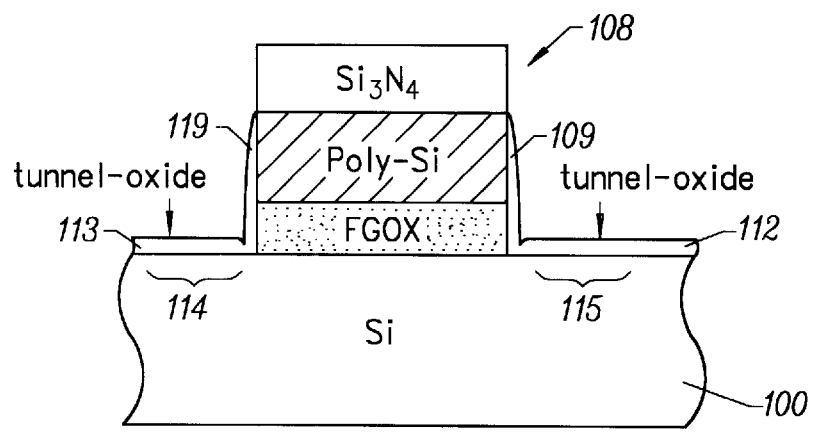

FIG. 6 illustrates a step after formation of the stack structure 108. In FIG. 6, a thin floating gate insulator (tunnel insulator) is grown comprising, for example, silicon dioxide or silicon oxynitride. The thin insulator can be implemented using oxynitride or oxide/nitride layers. Many manufacturing techniques may be utilized to achieve ultra-thin oxynitride films including (a) thermal oxidation with a nitric oxide (NO) anneal, (b) thermal oxide subjected to a thermal nitridation in ammonium, and (c) thermal oxide subjected to thermal nitridation in $N_2O$. The first method involving thermal oxidation plus nitric oxide anneal is believed to provide the best quality. The oxide/nitride layer alternative can be made with techniques known in the art.

For more moderately thin insulating layers, in the range of 70–100 angstroms, both oxide and oxinitride layers may be utilized.

The thin insulator is formed on the side 109 and side 119 of the stack structure 108. Also, the thin insulator is formed over the substrate in the regions 112 and 113. This thin insulator is grown over the substrate 100 while it is moderately P-type doped. This allows for growth of a high quality tunnel insulator having a thickness from 5 to 10 nm and preferably about 8 nm or less, relatively uniformly over the tunnel region, generally 114 and 115 of the structure being formed.

Figure 7:
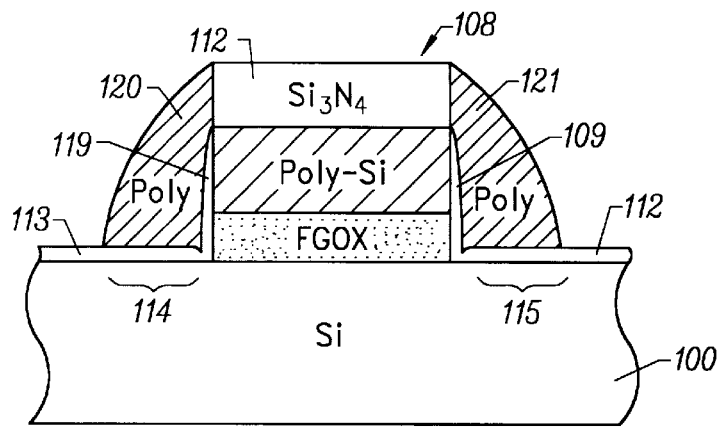

After growth of the tunnel insulator (112, 113), side wall spacers are formed on the stack structure over the thin insulator layer (109, 112 and 119, 113). FIG. 7 shows the side wall spacer 120 and side wall spacer 121 formed on the sides of the stack structure, generally 108. The spacers overlie the thin insulator in the region 119, and in the tunnel region 114, and overlie the tunnel insulator in the region 109 and the tunnel region 115. Formation of the side wall spacers (120, 121) is accomplished by depositing a layer of polysilicon over the entire structure and then anisotropically etching the polysilicon until the cap material 112 is exposed, and the thin insulator outside the channel regions 114 and 115 is exposed.

Figure 8:
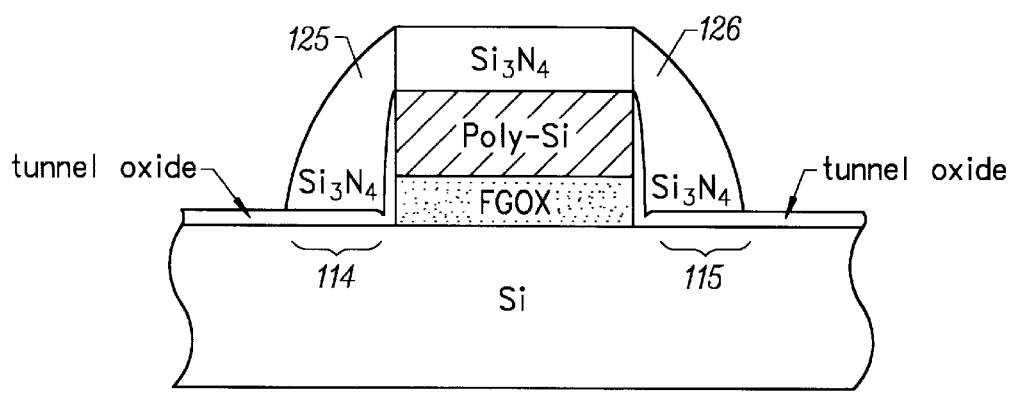

FIG. 8 illustrates an alternative choice for the spacer material. According to FIG. 8, silicon nitride side wall spacers 125 and 126 are used. The silicon nitride spacers are formed using the same technique as the polysilicon spacers by deposition of a layer of silicon nitride and anisotropically etching.

It has been reported that the growth of dislocation loops created by the arsenic implant is affected by the presence of recoiled oxygen atoms from implant through oxide film. The energy of breaking a nitrogen bond in a $Si_3N_4$ film (101.9 ev*3=305.7ev) is greater than that required to break an oxygen bond in an oxide film (103.4 ev*2=206.8 ev). Therefore, it is expected that the amount of recoiled nitrogen would be lower in a $Si_3N_4$ screen mask. Also, polysilicon is considered as an effective film to eliminate the recoiled oxygen atoms. It has been verified by experiment that the amount of recoiled oxygen atoms was relatively low even for $Si_3N_4$-only film and two orders of magnitude less nitrogen atoms were created in that case than for oxygen atoms in the $SiO_2$-only case. Furthermore, the recoiled nitrogen atoms were not gettered at the defect sites and dislocation loops can be suppressed. Attributed to these features, much better tunnel oxide and the oxide/silicon interface can be achieved according to the present invention. Major advantages provided by the improved tunnel oxide quality and thickness uniformity are with respect to reliability such as cycling endurance, charge retention, etc., which are closely related to the band-to-band tunneling (BBT) induced hot hole injection (H.H.I.). In other words, the suppression of BBT and H.H.I. is critically important to enhance the endurance and charge retention.

In both the silicon nitride and polysilicon side wall processes, the length of the tunnel regions 114 and 115 is controlled by the thickness of the layer of spacer material which is deposited prior to the anisotropic etch. Thus, the length of the side wall spacers can be controlled with relatively high resolution. Also, the etching profile of the anisotropic etch process can be utilized to control spacer width and thereby the tunnel region sizes. For example, the etching profiles can be controlled by several factors including (1) the poly-gate etching profile (2) the conformity of films which are deposited on the poly-gate stack as the spacer material, and (3) plasma etching conditions such as power, gas composition and gas flow rate.

Figure 9:
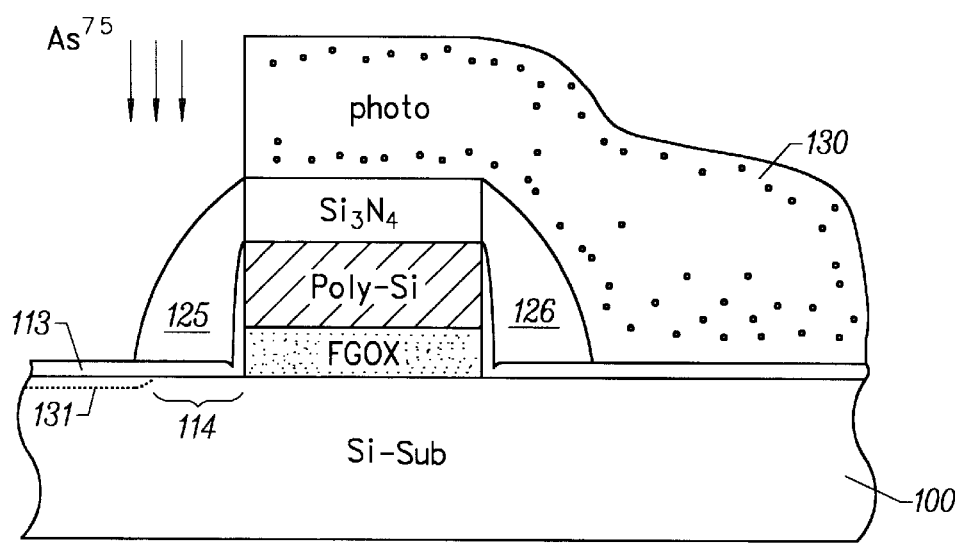

FIG. 9 illustrates the process used for implanting dopants into the buried drain region. According to the process illustrated in FIG. 9, the stack structure with nitride spacers 125 and 126 (or, alternatively, polysilicon spacers 120 and 121), are masked using a photolithography technique, which results in a layer of photoresist 130 overlying the source side of the stack structure. The drain side of the stack structure 108 exposed to an N-type implant, preferably arsenic $As^{75}$, having a dose of the order of $10^{15}$ cm$^{-2}$ results in a N+ doping profile for the drain in the region 131 self-aligned with the side wall spacer 125. Optionally, an N- implant is also used. This N- implant is preferably phosphorus $P^{31}$, having a dose on the order of $10^{14}$ cm$^{-2}$. It can be seen, the thin insulator layer 113 where it overlies the tunnel region 114 and the substrate 100 in the tunnel region 114 are protected from the ion implant damage caused by impact of the ions being implanted.

Figure 10:
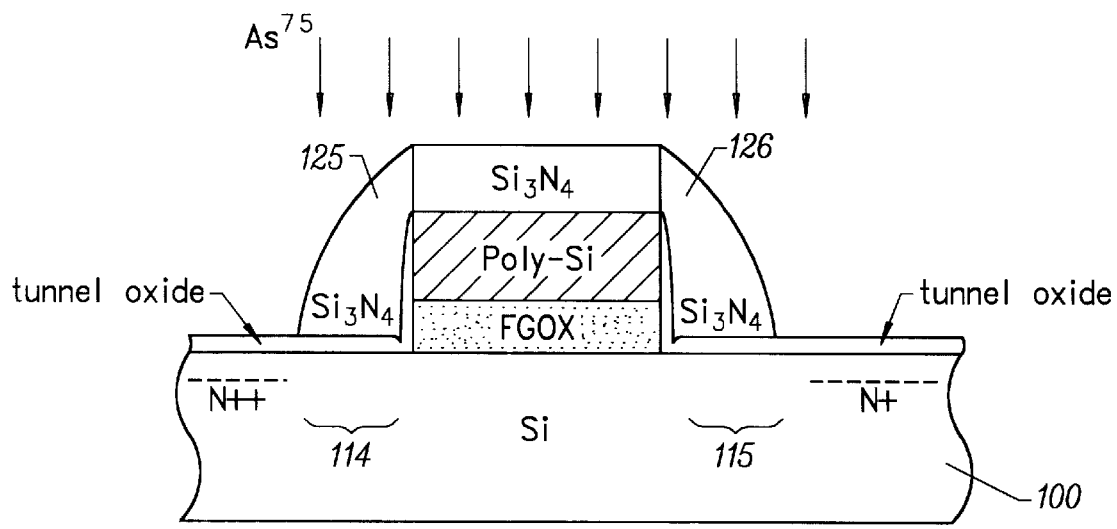

FIG. 10 illustrates the process used for implanting the source side of the stack structure as well as providing additional implant concentration on the drain side. As shown in FIG. 10, the photoresist 130 in FIG. 9 is removed. This leaves the side wall spacers 125 and 126 on the drain side and the source side exposed to the implant process. An $As^{75}$ implant is used which results in a doping dose on the source side on the order of $10^{15}$ cm$^{-2}$. This results in an N++ doping concentration in the drain region, and an N+ doping concentration in the source region. Again, the side wall spacers 125 and 126 protect the thin insulator and substrate in the tunnel region 114 and tunnel region 115 from the impact of the arsenic ions during the implantation process.

After the implant of FIG. 10, a cell reoxidation step is executed to improve the integrity of the tunnel insulator. The cell reoxidation is a thermal process which improves the quality of the tunnel insulator. Reoxidation is carried out by thermal oxidation in dry $O_2$, with temperatures preferably in the range of 850° to 900° C.

Figure 11:
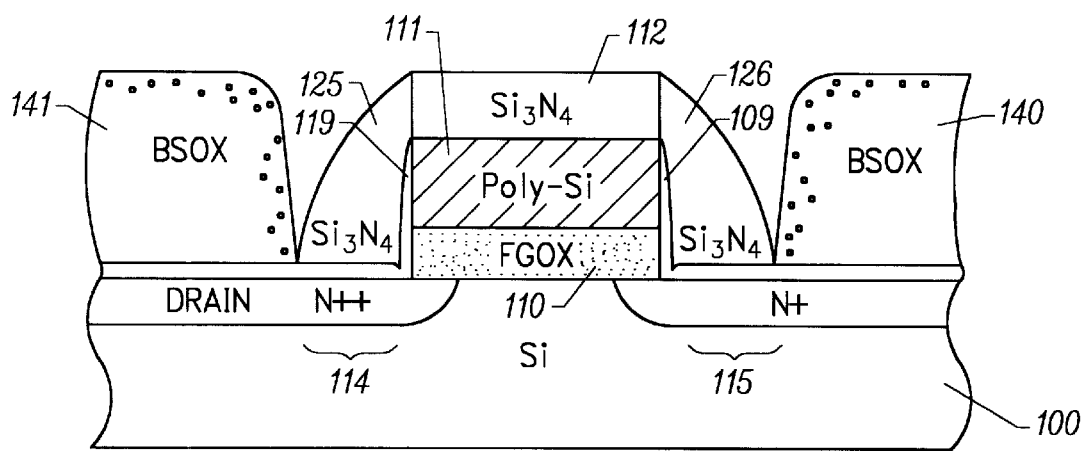

FIG. 11 illustrates a step in the process for the formation of isolation oxide, or other insulator layers. A chemical vapor deposition (CVD) oxide is formed over the device, and patterned to leave thick oxide regions 140 and 141 over the source and drain regions, aligned with the side wall spacers 125 and 126. This oxide layer (140, 141) provides for isolation of the source and drain regions from the overlying gate and word line structures.

As shown in FIG. 11, the cell reoxidation process provides a thermal load on the device which causes diffusion of the $As^{75}$ and, optionally, the $P^{31}$ dopants in the drain and source regions. The CVD oxide is required in two major respects: one is to withstand the oxide loss during several critical etching processes such as SAMOS etch and wordline patterning etch, etc, and the other is to provide for isolation of source/drain from wordlines. The advantage provided by a CVD process to implement the oxide is that encroachment into tunnel insulator near PL1 edge, which may cause degradation of F-N tunneling efficiency, can be minimized. The drain and source regions extend under the tunnel oxide in the tunnel region 114 and tunnel region 115. Also, the drain and source implants may diffuse into the channel area under the thicker insulator, as illustrated in the figure.

After formation of the isolation oxide layers 140 and 141, the side wall spacers are removed from the stack structure, as well as the cap material 112. This results in a stack structure, including the thicker insulator 110, the polysilicon floating gate material 111, and the tunnel insulator 119 and 109.

Figure 12:
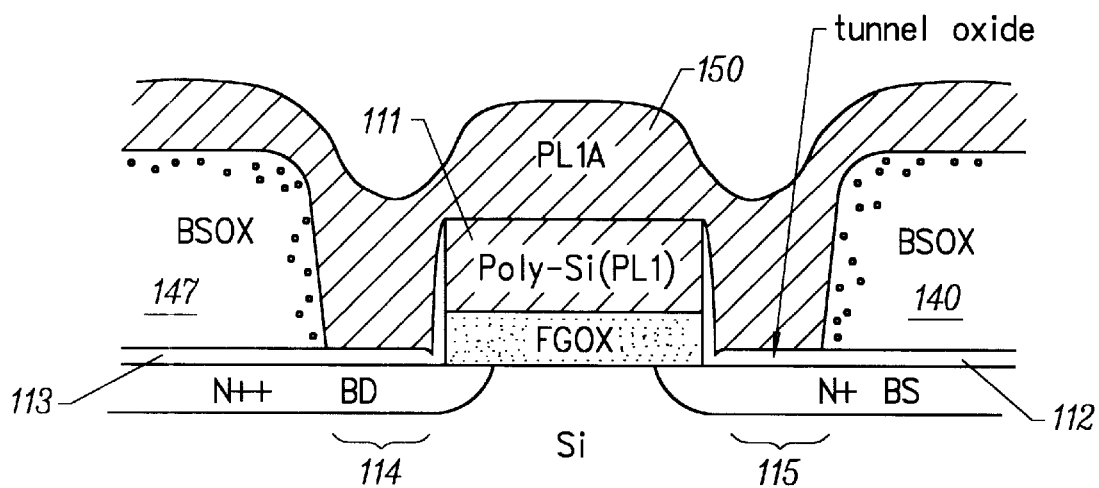

After removal of the side wall spacers (125, 126) and the cap 112, a second layer 150 of floating gate material is deposited and patterned as shown in FIG. 12. The second layer 150 of floating gate material is in electrical communication with the floating gate material 111 in the stack structure, and extends to the thin insulator 113 in the tunnel region 114 on the drain side, and to the thin insulator 112 in the tunnel region 115 on the source side. The patterned floating gate material in the second layer 150 overlies the CVD oxide 141 and 140 in order to increase the area of the floating gate and improve the capacitive-coupling ratio.

Figure 13:
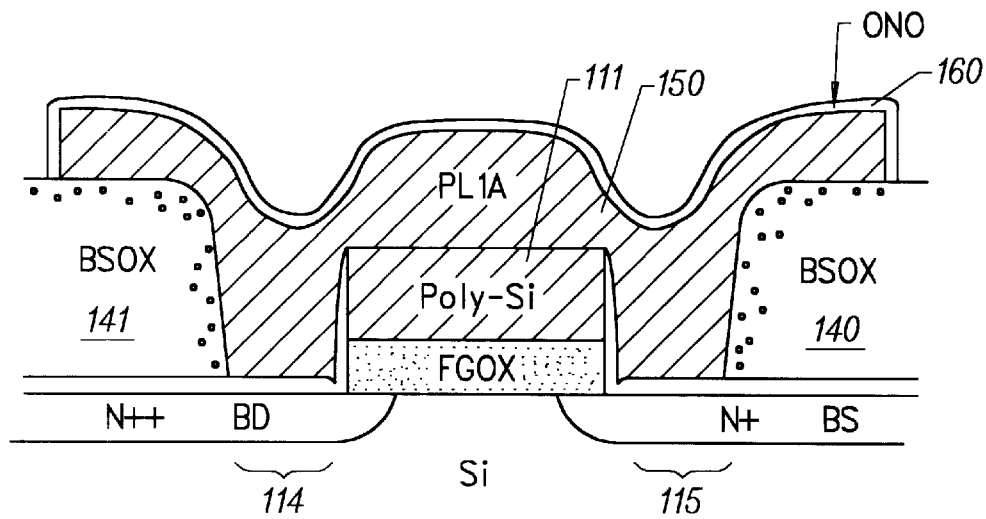

FIG. 13 illustrates a next step in the process. In particular, the control gate insulator 160 is grown over the floating gate material 150. The control gate insulator 160 consists of an ONO material. The ONO is patterned to isolate the floating gate composed of the layer 150 and the layer 111 from the overlying control gate material to be deposited.

Finally, a third layer of polysilicon is deposited and patterned to define a control gate structure 21 as shown in FIG. 1. An it situ doping step is performed to improve the conductivity of the control gate. The in situ doping is carried out using a $POCl_3$ doping process as a phosphorous doping source, introducing a doping material into the polysilicon by a thermal drive in step.

Figure 14:
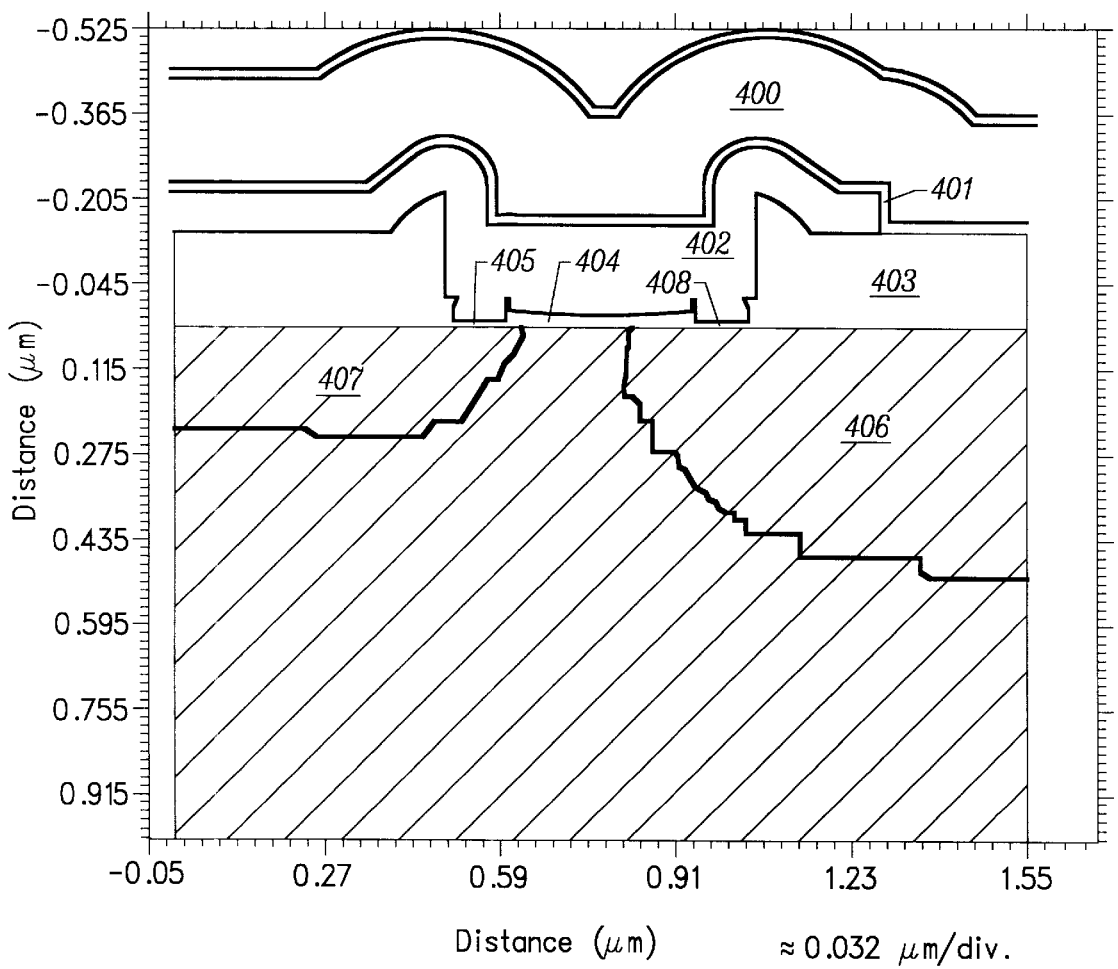
FIG. 14 is a simulated scale drawing of a floating gate transistor manufactured according to the present invention.

FIG. 14 is a diagram generated by a two-dimensional process simulator for the cell structure implemented according to the process described above. The diagram illustrates representative dimensions of cells according to the present invention. Thus, the diagram illustrates the word line polysilicon 400 overlying a inter-poly dielectric 401. The floating gate polysilicon 402 underlies the inter-poly dielectric 401. The floating gate insulator includes the tunnel region 405 on the source side 407, and the tunnel region 408 on the drain side 406. Also, a thicker insulator region 404 lies between the tunnel regions 405 and 408. The isolation oxide region 403 is formed on each side of the cell. The drain region 406 is deeper and extends further under the channel region of the cell than the source region 407 because of the greater concentration of implants and other process parameters.

It can be seen that the width of the thicker oxide region 404 over the channel area of the device is about 0.35 microns. The tunnel oxide regions 405, 408 have a width of about 0.1 microns. The buried source and buried drain regions are implanted through mask openings of about 0.5 microns.

The process is readily scaled to smaller channel widths for example, 0.25 microns, and smaller tunnel oxide widths, for example about 0.05 microns.

In the example shown in FIG. 14, the thickness of the thicker oxide over the channel region is greater than 10 nm, and in this example about 18.5 nm. The thickness of the tunnel oxide adjacent to the source and drain regions is less than 10 nm, for example from 5 to 8 nm. The dose of dopants in the buried drain (the double diffused embodiment) is As at about $5*10^{15}$ cm$^{-2}$, and P at about $5*10^{14}$ cm$^{-2}$. In the non-double diffused buried source region, the dose of As is about $3*10^{15}$ cm$^{-2}$.

The preferred range of thicknesses for the materials in the dual floating gate oxide flash memory cell is set out in table 1 as follows:

TABLE 1

Thicknesses of Critical Features

| | |
|---|---|
| Thicker floating gate oxide 402 | 150–250 Å |
| Thinner floating gate oxide 405, 408 | 50–100 Å |
| The first polysilicon layer 111 | 800–1000 Å |
| Silicon nitride film 112 | 150–500 Å |
| Second polysilicon layer 150 | 800–1000 Å |
| The CVD oxide 141, 140 | 1000–1500 Å |

Table two sets forth the width or length of features of the dual floating gate oxide flash memory cell of the present invention.

TABLE 2

Width or Length of Critical Features

| | |
|---|---|
| First Polysilicon Layer 111 | 0.25–0.5 microns |
| Tunnel Region 114, 115 | 0.05–0.15 microns |
| Buried source and Buried drain 407, 406 | 0.4–0.5 microns |

Figure 15:
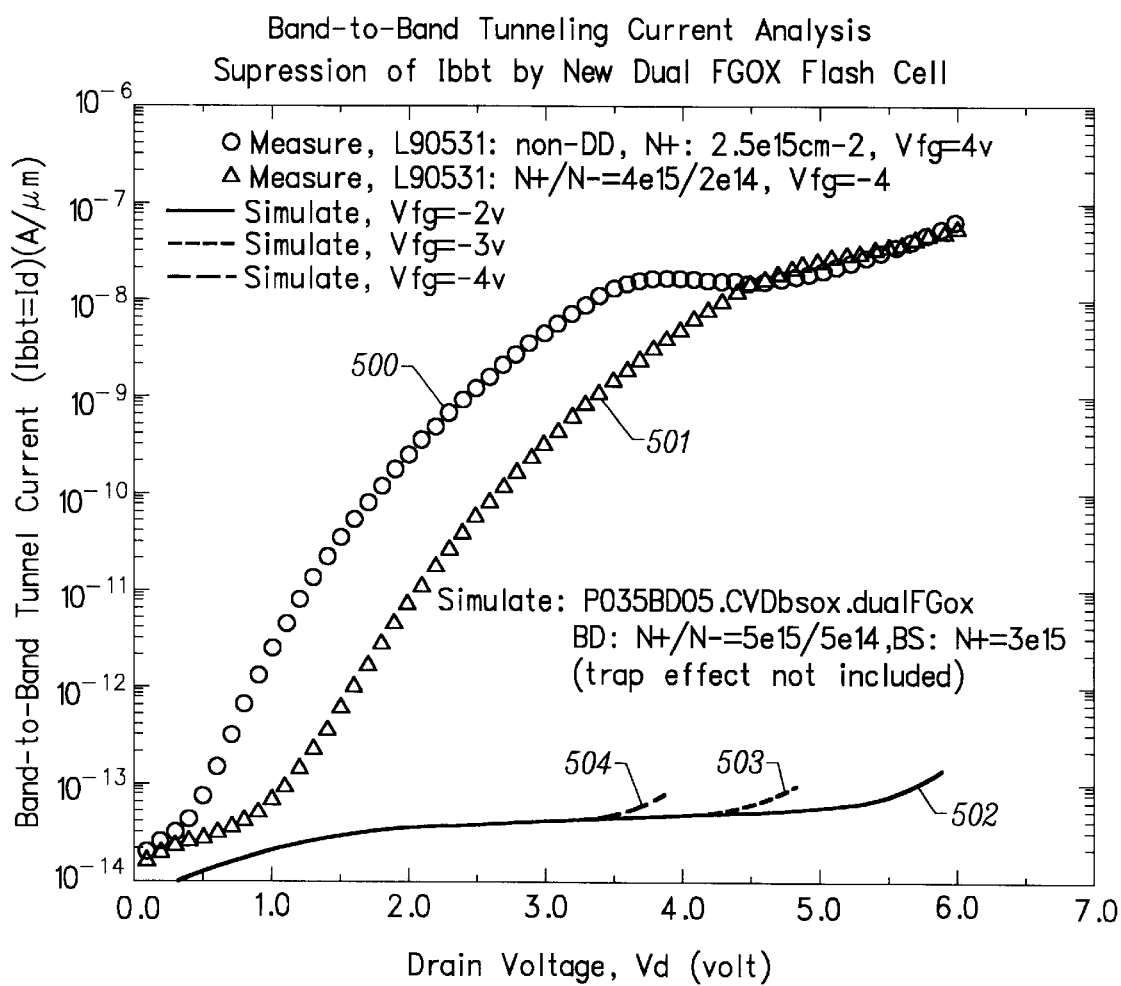
FIG. 15 is a graph based on band-to-band tunneling current analysis of floating gate transistors, including floating gate transistors according to the present invention.

FIG. 15 illustrates analysis of the band-to-band tunneling current characteristics of the dual floating gate oxide flash cell of the present invention. In FIG. 15, the band-to-band tunneling current in Amperes (amps) per micron, is plotted against the drain voltage for five representative designs. The first trace 500 represents the tunneling current for a standard floating gate cell without double diffused drain, having a floating gate bias of −4 V. The second trace 501 illustrates the characteristics of a standard floating gate cell with a double diffused drain, with a floating gate voltage of −4 V. Traces 502 through 504 are the result of simulation of the cell shown in FIG. 14 with a −2 V floating gate voltage, −3 V floating gate voltage, and −4 V floating gate voltage, respectively. The hole trapping effect is not included in the plot. As can be seen the band-to-band tunneling current for the floating gate cell manufactured according to the present invention with a 4 V drain voltage is about 0.1 picoamps per micron, five orders of magnitude less than the tunneling current for the standard floating gate cell, in which it is difficult to achieve band-to-band tunneling current of less than 10 nanoamps per micron with a drain voltage of 4 V. Because of the effective elimination of band-to-band tunneling current in the device of the present invention, the hot hole current caused by band-to-band tunneling is substantially eliminated, and the reliability of the cell is enhanced significantly.

Figure 16:
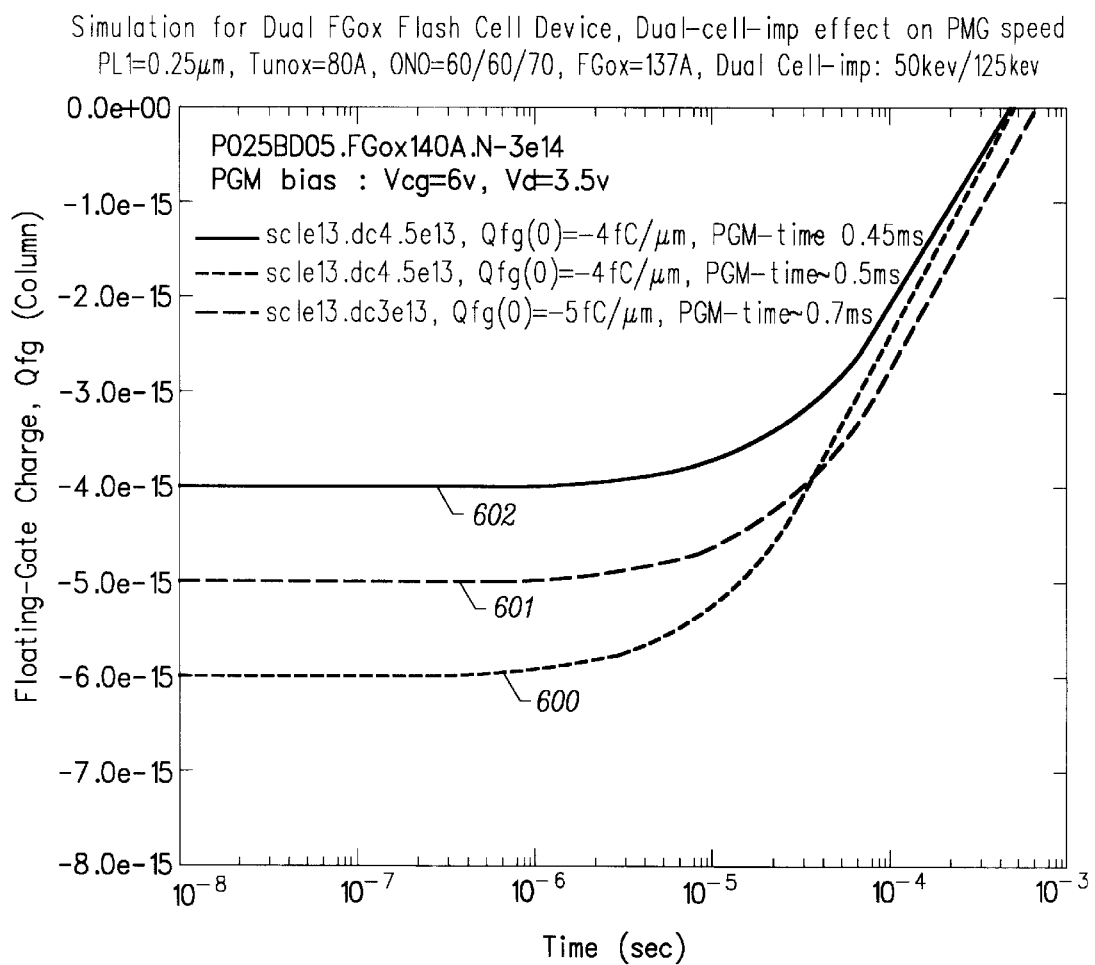
FIG. 16 is a graph providing information about simulation of the dual cell implant effect on program speed of devices manufactured according to the present invention.

Performance of flash cell devices is generally evaluated by the program and erase speed. FIG. 16 demonstrates the program speed under the bias conditions of −6 V on the control gate and 3.5 V on the drain where band-to-band tunneling current is negligible. The graph of FIG. 16 plots on traces 600, 601 and 602 the floating gate charge in Coulombs per micron versus log time in seconds for three selected starting conditions at $-6\times10^{-15}$, $-5\times10^{-15}$ and $-4\times10^{-15}$, respectively. The device simulated in FIG. 16 has a 0.25 micron channel width defined by the first layer of polysilicon, a tunnel oxide of about 8 nm, and ONO structure of 6 nm×6 nm×7 nm, and a thicker floating gate oxide of about 14 nm. A dual cell implant is utilized with 50 kev for the shallow implant and 125 Kev for the deeper implant. As can be seen, the program speed for a control gate ranges from about 450 microseconds to 700 microseconds, demonstrating high tunneling efficiency of the structure according to the present invention.

Figure 17:
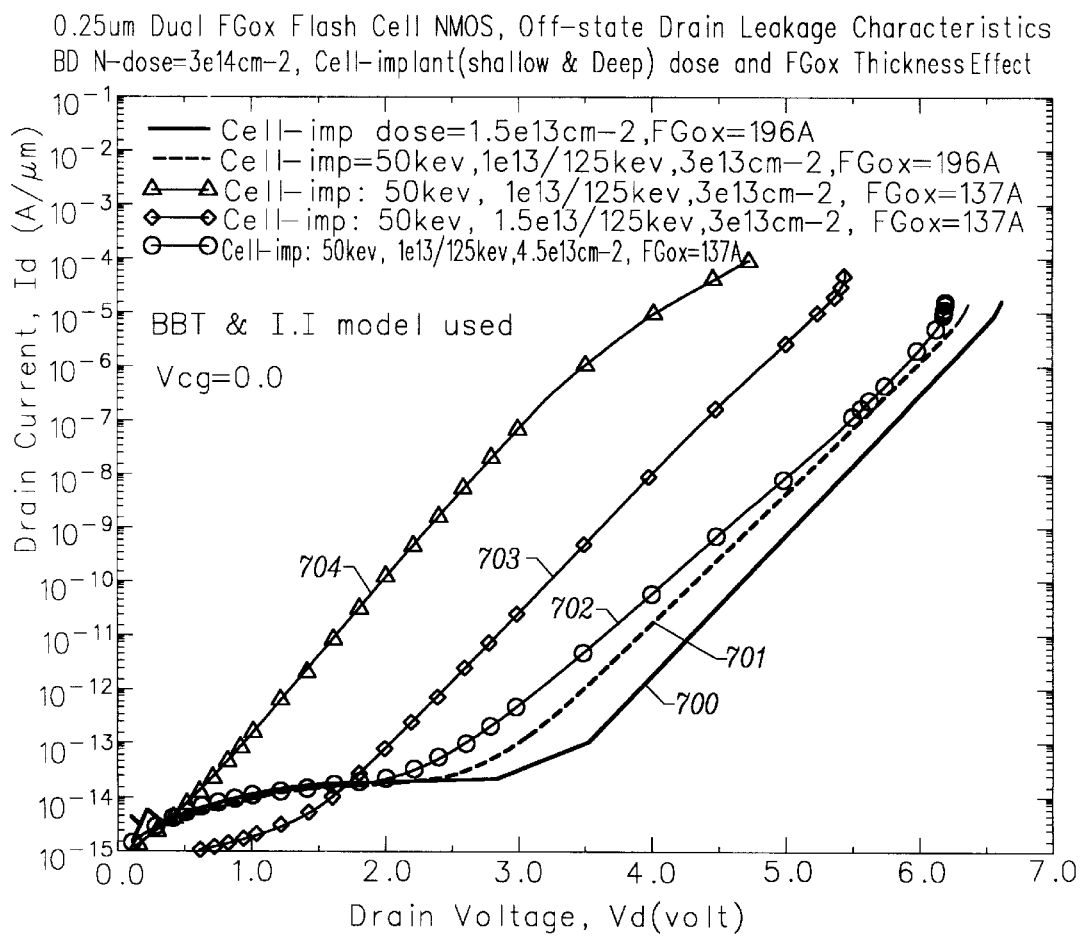
FIG. 17 is a graph illustrating the drain leakage characteristics of floating gate transistors manufactured according to the present invention.

FIG. 17 is a graph of drain current versus drain voltage, to illustrate the drain turn on immunity. In FIG. 17, trace 700 corresponds to a device having a single cell implant dose of $1.5\times10^{13}$ cm$^{-2}$ and having a thick oxide of 196 angstroms. Trace 701 corresponds to a double-diffused cell having a shallow cell implant at 50 Kev, with a dose of about $1\times10^{13}$ cm$^{-2}$, and a deep cell implant at 125 Kev, with a dose of about $3\times10^{13}$ cm$^{-2}$, and having a thick oxide of about 196 angstroms. Trace 702 corresponds to a double-diffused cell with a shallow implant (50 Kev) dosage of $1\times10^{13}$ cm$^{-2}$ and a deep implant at 125 Kev with a dose of about $4.5\times10^{13}$ cm$^{-2}$, with a thick oxide having a thickness of 137 angstroms. Trace 703 is a double-diffused cell having shallow implant dose (50 Kev) at $1.5\times10^{13}$ cm$^{-2}$ and a deep implant (125 Kev) dosage at $3\times10^{13}$ cm$^{-2}$, and having a thick oxide with a thickness of about 137 angstroms. Trace 704 is a double-diffused cell with a shallow implant (50 Kev) having dose of about $1\times10^{13}$ cm$^{-2}$, and a deep implant (125 Kev) with a dose of $3\times10$ cm$^{-2}$, with a thick oxide having a thickness of about 137 angstroms. The cell parameters for the plots of FIG. 17 include a 0.25 micron channel width defined by the width of thick oxide, and an implant dosage in the buried drain of about $3\times10^{14}$ cm$^{-2}$. The diagram illustrates that increasing the floating gate oxide thickness (traces 700, 701) over the channel region dominates over increasing cell implant dosage (traces 702, 703, 704) for the purpose of suppressing drain turn on induced drain leakage.

"Drain-turn-on" is a specific effect existing in floating gate type cell devices, caused by the drain coupling effect. In general, drain coupling ratio (DCR) and drain-turn-on voltage (Vdto) are defined to quantify drain-turn-on immunity. Both DCR and Vdto are defined at Vcg=0 (Vcg is the bias applied to the control gate CG). DCR is the rate of Vfg change with respect to Vd variation (Vfg is the voltage of floating gate which is coupled from drain bias Vd); and Vdto is defined as the drain bias at which Vfg coupled from drain is large enough to cause subthreshold leakage. Therefore, two approaches can be used to enhance drain-turn-on immunity, that is to increase Vdto; they are (i) to reduce DCR, and (ii) to increase the dummy cell threshold voltage VTD (dummy cell is the cell device with FG shorted to CG). For this dual FGox flash cell device, $V_{TD}$ is increased due to thicker FGox in the channel region. From simulation, drain-turn-on induced drain leakage characteristics are shown in FIG. 17 for FGox=137 A and 196 A, and with split cell implant doses. Dual energy cell implants are adopted. Shallow cell implant energy is fixed at 50 kev, and deep cell implant energy is fixed at 125 kev). It is concluded that to increase FGox thickness is the better approach to increase $V_{TD}$ and Vdto than to increase the cell implant doses. It is because drain leakage is determined not only by drain-turn-on; there are three major mechanisms responsible for flash cell drain leakage and limiting the drain operation voltage: (i) band to band tunneling BBT induced GIDL (Gate Induced Drain Leakage), (ii) avalanche breakdown-induced drain leakage, and (iii) drain-turn-on induced drain leakage. If we increase cell implant doses, both (i) and (ii) will be enhanced. Hence, thicker FGOX in the channel region can provide three advantages in this respect: (i) increase of Vdto due to increased $V_{TD}$ and reduction of DCR, (ii) suppression of BBT and hot hole injection attributed to lower electric field; and (iii) enhancement of GCR (Gate-Coupling Ratio) and resulting scalability of operation voltages for program, erase and read.

Figure 18:
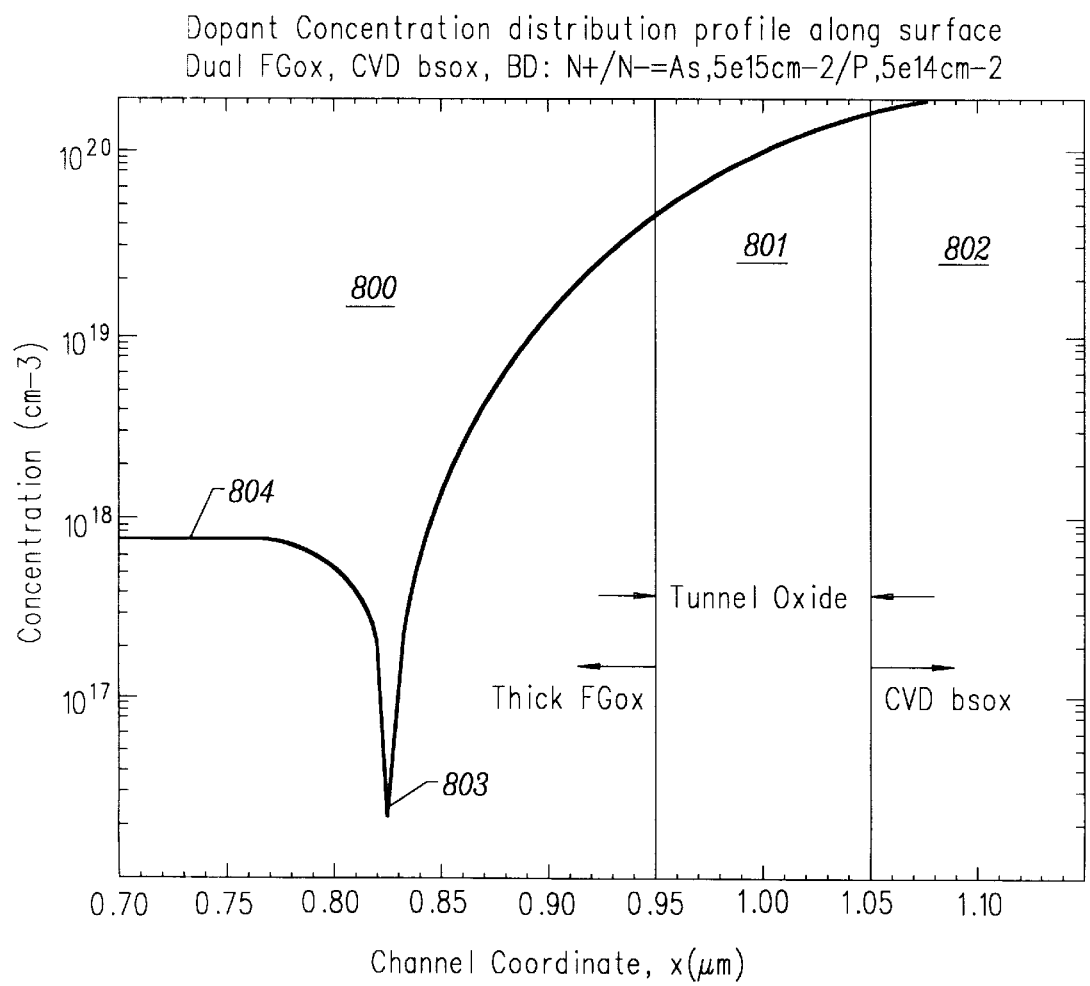
FIG. 18 is a graph illustrating dopant dose distribution along the surface of the device manufactured according to the present invention.

FIG. 18 is a graph of dopant concentration distribution profiles along the surface of the silicon substrate for the structure according to the present invention. The characteristics of the cell upon which the graph of FIG. 18 was generated, include double-diffusion As in the drain region having a dose of about $5*10^{15}$ cm$^{-2}$, and P having a dose of about $5*10^{14}$ cm$^{-2}$. The region 800 underlies the thicker floating gate oxide. The region 801 underlies the tunnel oxide, and the region 802 underlies the thick CVD oxide. As can be seen, the concentration of dopants in the tunnel oxide region 801 is near or greater than the degenerately doped concentration of about $5*10^{19}$ cm$^{-3}$. Under the thicker floating gate oxide in the region 800, the junction point 803 is formed due to dopant concentrations between the P type implant in the channel and the N type implant in the source and drain regions. The channel region is moderately doped, with a surface concentration noted by the point 803. The regions in which the floating gate overlaps the drain and source are partially covered by the thicker floating gate oxide in the region 800, and by the thinner oxide in the region 801. The part covered by the thicker floating gate oxide in the region 800 is at a dopant concentration which is not high enough to reach the degenerate condition. The non-degenerately doped overlap region occurs due to lateral diffusion of the source and drain regions.

As can be seen in FIG. 18, the doping concentration in regions covered by the thicker floating gate oxide is not high enough to reach a degenerate condition, such that band-to-band tunneling current might occur if a thinner oxide occurred over the channel region. However, because the thick oxide occurs over the moderately doped region, band-to-band tunneling current is substantially eliminated. The doping concentration over the tunnel insulator is no less than $5*10^{19}$ cm$^{-3}$, where band bending at a level sufficient to cause the band-to-band tunneling current does not occur.

The present invention improves substantially over Hisamune et al. for a number of reasons. First, the growth of thin oxide, with respect to thickness and quality, is very difficult to control over a heavily doped region as done by Hisamune et al. This is because silicon oxidation rate is dependent on the impurity concentration, and the oxidation rate is enhanced over a heavily doped region, so ultra-thin tunnel oxide is not easy to achieve. Moreover, an oxide of uniform thickness is almost impossible to obtain on a heavily doped region masked with patterned poly-gate. Another impact is on quality. It is well known that ion implantation causes radiation damage to the crystalline silicon substrate and creates as-grown defects. The thin oxide quality is critically determined by the quality of silicon substrate, especially the silicon surface, and BBT generation is enhanced due to the as-grown traps caused by implantation damage at the silicon/oxide interface. Anomalously large gate induced drain leakage (GIDL) is observed for conventional devices without drain engineering, such as lightly doped drain (LDD), double diffused drain (DD), and large-angle tilt implant drain (LATID), etc. and the as-grown-trap-assisted tunneling is believed to be a major source of enhanced GIDL.

From the above, we see that tunnel oxide quality and thickness uniformity, inadequately addressed by Hisamune, el al., are improved by the present invention. The tunnel oxide of the present invention is grown before arsenic implant, and a $Si_3N_4$ or polysilicon spacer is formed to mask the subsequent arsenic implant.

The two basic conditions required for band-to-band tunneling current are successfully overcome in the process of the present invention. First, in order for band-to-band tunneling current to occur, the silicon surface band-bending must be no less than the silicon energy band gap (Eg (T=300 K)=1.12 ev). Second, for band-to-band tunneling current to occur, the electric field must be no less than the critical field that creates large enough band-to-band tunneling generation rate. The total electric field involved in this process is composed of the lateral field and the transverse field. The band-to-band tunneling current increases exponentially with the total electric field.

$$Gbbt = AE^2 e^{(-B/E)}$$

$$E = (E_L^2 + E_T^2)^{1/2}$$

where
Gbbt: band-to-band tunneling generation rate
$E_L$: lateral electric field
$E_T$: transverse electric field
E: total electric field
A and B: fitting parameters In order to satisfy the band-bending requirement for band-to-band tunneling, the dopant concentration must be moderate, for example no larger than about $5*10^{19}$ cm$^{-3}$ for arsenic and phosphorous implanted single crystal silicon, which approaches the degenerately doped concentration values encountered in the source and drain.

The dual floating gate oxide cell of the present invention minimizes the band-to-band tunneling current and band-to-band tunneling induced hot hole injection. Two key points accomplish this suppression of band-to-band tunneling current. First, the high quality, thin oxide covers a degenerately doped region. Second, a thicker oxide covers a moderately doped region. Thus, there is no region which satisfies the two necessary conditions for band-to-band tunneling simultaneously.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for manufacturing a floating gate transistor on a substrate, the transistor having a drain in the substrate, a source in the substrate, a channel in the substrate between the source and the drain, a floating gate over the channel, a floating gate insulator between the floating gate and the substrate, a control gate over the floating gate, and a control gate insulator between the floating gate and the control gate, comprising the steps of:

forming an insulator layer on the substrate;

forming a first floating gate material layer over the insulator layer;

etching the insulator layer and first floating gate material layer to define a stack structure;

forming a tunnel insulator over the substrate and sides of the stack structure;

forming side wall spacers on the sides of the stack structure over the tunnel insulator layer, to define a tunnel region in the substrate;

implanting source and drain dopants into the substrate in alignment with the side wall spacers on the stack structures to define the source and the drain, where the side wall spacers mask the tunnel insulator layer over the tunnel region from the dopants being implanted;

removing the side wall spacers;

completing formation of the floating gate by forming a second layer of floating gate material in electrical communication with the floating gate material in the stack structure, and over the tunnel insulator layer in the tunnel region; and completing formation of the control gate insulator and control gate.

2. The method of claim 1, including after the step of forming a first floating gate material layer, forming a cap material layer over the first floating gate material layer, and wherein the stack structure includes a stack including the insulator layer, the first floating gate material layer and the cap layer.

3. The method of claim 1, wherein the step of forming side wall spacers includes:

forming a layer of spacer material over the stack structure and tunnel insulator layer, and anisotropically etching the spacer material.

4. The method of claim 3, wherein the cap material and the spacer material comprise silicon nitride.

5. The method of claim 3, wherein the cap material comprises silicon nitride and the spacer material comprises polysilicon.

6. The method of claim 1, wherein the insulator layer comprises silicon dioxide.

7. The method of claim 6, wherein the tunnel insulator comprises silicon dioxide.

8. The method of claim 1, wherein the step of implanting source and drain dopants includes:

forming a mask on a source side of the stack structure with side wall spacers;

implanting dopants on a drain side of the stack structure in alignment with the side wall spacer on the drain side;

removing the mask on the source side; and implanting dopants on the drain side and the source side in alignment with the side wall spacers.

9. The method of claim 1, including reoxidizing the tunnel insulator layer after the step of implanting.

10. The method of claim 1, wherein the step of completing the floating gate comprises:

patterning the second layer of floating gate material to define at least one dimension of the floating gate; and the step of completing the control gate insulator and control gate comprises forming a control gate insulator layer over the second layer of floating gate material either before or after the step of patterning the second layer of floating gate material; and forming a control gate over the control gate insulator.

11. The method of claim 1, including before the step of removing the side wall spacers, the step of:

forming an isolation insulator over the substrate adjacent to the side wall spacers.

12. The method of claim 1, wherein a thickness of the insulator layer is greater than a thickness of the tunnel layer.

13. The method of claim 12, wherein the thickness of the insulator layer is greater than 10 nanometers.

14. The method of claim 12, wherein the thickness of the tunnel layer is less than 10 nanometers.

15. The method of claim 12, wherein the thickness of the insulator layer is greater than 10 nanometers, and the thickness of the tunnel layer is less than 10 nanometers.

16. The method of claim 1, wherein the step of implanting source and drain dopants includes;

diffusing dopants into the tunnel region so that a dose of dopants in the tunnel region beneath at least a portion of the tunnel layer is near, equal to, or greater than a degenerately doped concentration.

17. The method of claim 1, including the step of:

implanting dopants in the channel using a lower energy process and a higher energy process, the dopants implanted in the channel having a conductivity type opposite to that of the drain dopants implanted into the substrate.

* * * * *